(12) United States Patent
Kim

(10) Patent No.: US 7,492,190 B2
(45) Date of Patent: Feb. 17, 2009

(54) SEMICONDUCTOR MEMORY DEVICE CAPABLE OF ADJUSTING EFFECTIVE DATA PERIOD

(75) Inventor: Yong-Mi Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 149 days.

(21) Appl. No.: 11/124,317

(22) Filed: May 6, 2005

(65) Prior Publication Data

US 2006/0139060 A1 Jun. 29, 2006

(30) Foreign Application Priority Data

Dec. 28, 2004 (KR) .................. 10-2004-0113624

(51) Int. Cl.
*H03K 19/094* (2006.01)
(52) U.S. Cl. ......................... 326/83; 326/87
(58) Field of Classification Search .................. 326/29, 326/82, 83, 86; 327/108, 109
See application file for complete search history.

(56) References Cited

U.S. PATENT DOCUMENTS

| | | | | |
|---|---|---|---|---|
| 4,567,378 A | * | 1/1986 | Raver | .......................... 326/27 |
| 5,821,783 A | * | 10/1998 | Torimaru et al. | ............ 327/108 |
| 5,920,518 A | | 7/1999 | Harrison et al. | |
| 6,958,638 B2 | * | 10/2005 | Shibata et al. | ............... 327/170 |
| 2002/0030511 A1 | * | 3/2002 | Sher et al. | ...................... 326/87 |
| 2002/0112215 A1 | * | 8/2002 | Keller et al. | .................... 716/4 |

FOREIGN PATENT DOCUMENTS

| | | |
|---|---|---|
| JP | 11-250666 | 9/1999 |
| KR | 1993-0005366 | 3/1993 |
| KR | 1999-0061046 | 7/1999 |
| KR | 2003-0077205 | 10/2003 |

* cited by examiner

*Primary Examiner*—Rexford Barnie
*Assistant Examiner*—Thienvu V Tran
(74) *Attorney, Agent, or Firm*—Blakely, Sokoloff, Taylor & Zafman

(57) ABSTRACT

A semiconductor memory device is capable of adjusting effective data period of data. The semiconductor memory device includes a buffering unit for buffering input data, a window adjusting unit, and a transmitting unit. The window adjusting unit is for adjusting a window of the buffered data outputted from the buffering unit in response to plural metal option. The window adjusting unit includes a first driving unit for driving an output node in response to the output signal from the buffering unit and a second driving unit for additionally driving the output node in response to the output signal from the buffering unit. Meanwhile, the transmitting unit delivers output of the window adjusting unit into a core block.

13 Claims, 4 Drawing Sheets

US 7,492,190 B2

SEMICONDUCTOR MEMORY DEVICE CAPABLE OF ADJUSTING EFFECTIVE DATA PERIOD

FIELD OF INVENTION

The present invention relates generally to a semiconductor design technique; and more particularly a semiconductor memory device capable of assuring effective data period margin by adjusting driving power of an input/output driver.

DESCRIPTION OF PRIOR ART

Generally, since a semiconductor memory device operates in synchronization with a clock, input/output data should meet setup/hold time for the corresponding clock.

The setup/hold time is the effective data period that should be maintained around the clock edge. More specifically, the setup time is the time to be assured prior to the clock edge and the hold time is the time to be maintained after the clock edge.

In addition, the effective data period means a region in which a logic level decision for a signal is available. There are low-effective data period in which the signal is decided as in logic level "L" and high-effective data period in which the signal is decided as in logic level "H".

Actually, the semiconductor memory device recognizes the signal as logic level L when the voltage level of the signal is lower than Vref(reference voltage)−0.25 mV and recognizes the signal as logic level H when the voltage level of the signal is higher than Vref(reference voltage)+0.25 mV.

Accordingly, even though the signal has a certain activation pulse width, actual effective data period is shortened when transition period becomes long so as to make the time to the low-effective data period or the high-effective data period long and, other wise, the effective data period is lengthened when the transition period becomes short.

FIG. 1 is a block diagram showing a conventional semiconductor memory device.

Referring to FIG. 1, the conventional semiconductor memory device includes a buffering unit 10 for receiving applied data IN_DATA, a delaying unit 20 for delaying the output data AA from the buffering unit 10 to meet the setup/hold time for a clock, a latching unit 30 for outputting the positive output aa and the negative output aa' of the delaying unit 20 in response to a strobe signal strb_sig, and a core block 40 for receiving the positive output bb and the negative output bb' of the latching unit 30.

First, the buffering unit 10 shifts the level of the applied data IN_DATA to swing within an internal voltage. Then, the delaying unit 20 delays the output signal AA of the buffering unit 10 to meet setup/hold time specification for data against the clock.

Then, the latching unit 30 latches the positive output aa and the negative output aa' of the delaying unit 20 to apply them into the positive output bb and the negative output bb' of the core block 40, respectively, in response to activation of the strobe signal strb_sig.

As such, the semiconductor memory device synchronizes the externally applied data with an internal clock and makes the data swing in the internal voltage level to convert the data to internal data to be used in the core block.

Since data can be recognized as data only when data meets the setup/hole time, it is critical to meet the setup/hold time.

For this, the conventional semiconductor memory device adjusts the delay amount of the delaying unit to make data meet the setup/hold time, with estimating the effective data period of the output data from the buffering unit 10.

However, in implementation of a chip, the output data from the buffering unit 10 could have its effective data period different from the expected logic level. This comes out from the fact that the buffering unit 10 takes one of its paths depending on logic level.

For example, data is outputted through an NMOS transistor of the buffering unit 10 when data has the logic level "H", while data is outputted through a PMOS transistor of the buffering unit 10 when data has the logic level "L".

Accordingly, conventionally, the effective data period from each transistor is designed to be constant by adjusting the size of each transistor with regard to difference between driving power of carriers of the PMOS transistor and the NMOS transistor.

However, since transition period of a signal could vary because of variation of the driving power of each transistor due to variation of process, voltage or temperature (PVT), the effective data period cannot be constant between the data logic levels.

Therefore, in the conventional semiconductor memory device, the size of each transistor should be re-adjusted when the effective data period changes depending on the data logic level, which leads costly and timely deterioration.

SUMMARY OF INVENTION

It is, therefore, an object of the present invention to provide a semiconductor memory device capable of adjusting effective data period of data.

In accordance with an aspect of the present invention, there is provided a semiconductor memory device including a buffering unit for buffering input data; a window adjusting unit for adjusting a window of the buffered data outputted from the buffering unit in response to plural metal options; and a transmitting unit for delivering output of the window adjusting unit into a core block.

In accordance with another aspect of the present invention, there is provided a semiconductor memory device including a buffering unit for buffering input data; a window adjusting unit for adjusting a window of the buffered data outputted from the buffering unit in response to plural fuse options; and a transmitting unit for delivering output of the window adjusting unit into a core block.

In accordance with still another aspect of the present invention, there is provided a semiconductor memory device including a rising window adjusting unit for adjusting effective data period of rising output data; a falling window adjusting unit for adjusting effective data period of falling output data; and an output data driving unit for driving a data pin with the output signals from the rising window adjusting unit and the falling window adjusting unit.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
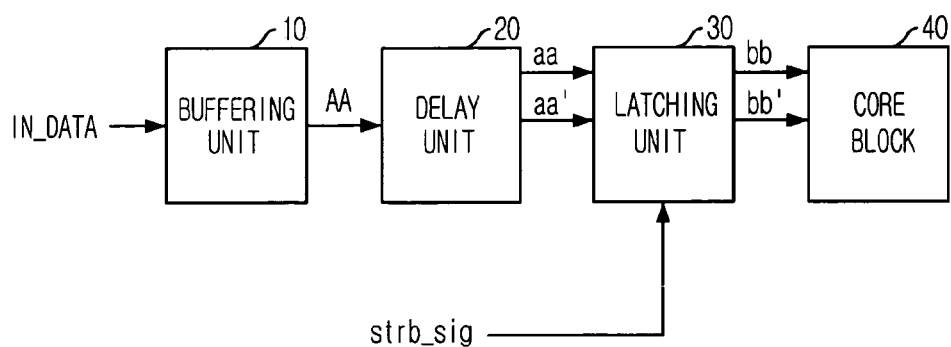
FIG. 1 is a block diagram showing a conventional semiconductor memory device.
Figure 2:
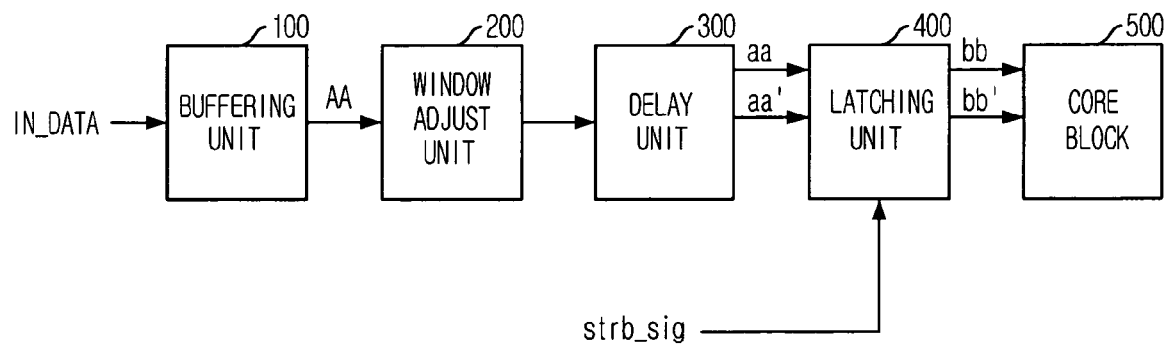
FIG. 2 is a block diagram showing a semiconductor memory device in accordance with a preferred embodiment of the present invention.

FIG. 2 is a block diagram showing a semiconductor memory device in accordance with a preferred embodiment of the present invention.

Referring to FIG. 2, the semiconductor memory device includes a buffering unit 100 for buffering input data IN_DATA, a window adjusting unit 200 for adjusting a window of the output data AA from the buffering unit 100 and outputting an inverse data of the buffered data, and a transmitting unit including inverters for inverting the output data of the window adjusting unit 200.

Meanwhile, in another embodiment, the inverters can be included in the window adjusting unit 200 instead of the transmitting unit.

Herein, the transmitting unit is provided with a delaying unit 300 for delaying the output data of the window adjusting unit 200 to meet the setup/hold time for data against a clock and a latching unit 400 for outputting the positive and the negative outputs aa, aa' from the delaying unit 300 in response to a strobe signal strb_sig, and a core block 500 for receiving the positive and the negative outputs bb, bb' from the latching unit 400.

Figure 3:
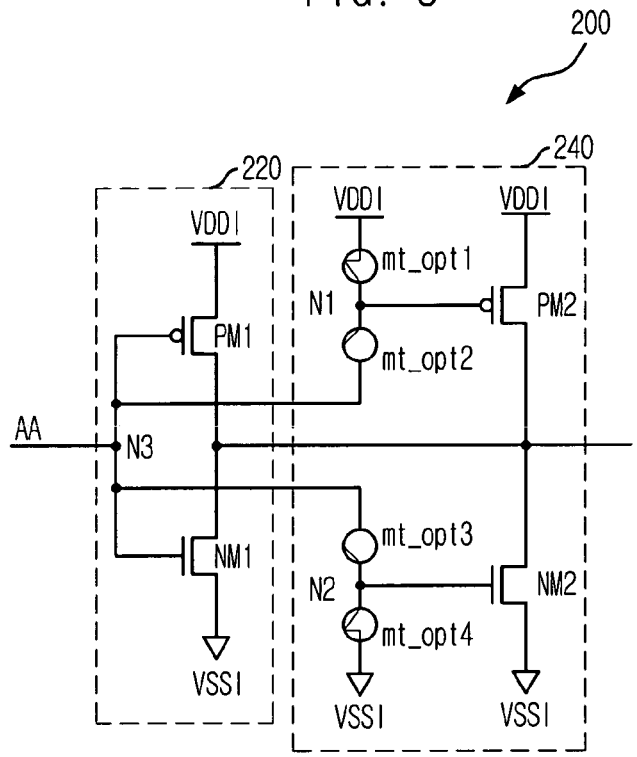
FIG. 3 is an internal circuit diagram of a window adjusting unit in FIG. 2.

FIG. 3 is an internal circuit diagram of a window adjusting unit 200 in FIG. 2.

Referring to FIG. 3, a window adjusting unit 200 includes a first driving unit 220 for driving an output node in response to the output signal AA of the buffering unit 100, and a second driving unit 240 for additionally driving the output node in response to the output signal AA from the buffering unit 100 depending on metal options mt_opt1, mt_opt2, mt_opt3, mt_ppt4.

The first driving unit 220 includes a first PMOS transistor PM1 and a first NMOS transistor NM1. The first PMOS transistor PM1 and the first NMOS transistor NM1 have the output signal from the buffering unit 100 as the respective gate inputs, and are serially coupled to each other between a power voltage VDDI and a power voltage VSSI.

The second driving unit 240 includes a first metal option mt_opt1 arranged between the first power voltage VDDI and a node N1, a second metal option mt_opt2 arranged between the node N1 and an input node N3 of the window adjusting unit 200, a third metal option mt_opt3 arranged between the input node N3 of the window adjusting unit 200 and a node N2, a fourth metal option mt_opt4 arranged between the node N2 and the power voltage VSSI, and a second PMOS transistor PM2 and a second NMOS transistor NM2 having the first and the second nodes as the respective gates, and serially coupled to each other between the power voltage VDDI and the power voltage VSSI.

As described above, the semiconductor memory device implements the window adjusting unit 200 with the first and second driving units 220, 240 and selectively uses the second driving unit 240 with control of the metal options mt_opt1, mt_opt2, mt_opt3, mt_opt4.

That is, when the effective data period changes depending on the logic level of the output data AA from the buffering unit 100 due to process, voltage or temperature, it is controlled with the metal options mt_opt1, mt_opt2, mt_opt3, mt_opt4 of the second driving unit 240 in the window adjusting unit 200.

For example, if the high-effective data period is longer than the low-effective data period when the output data AA from the buffering unit 100 has the logic level "H", only the third metal option mt_opt3 is connected to make the NMOS transistor NM2 of the second driving unit 240 drive the output signal in response to the voltage on the second node N2.

Further, the second and the fourth metal options mt_opt2, mt_opt4 are disconnected and the first metal option mt_opt1 is connected so as to turn off the PMOS transistor PM2 of the second driving unit 240.

On the other hand, when the low-effective data period is longer than the high-effective data period, the second metal option mt_opt2 is connected so as to make the PMOS transistor PM2 of the second driving unit 240 drive the output signal in response to the voltage on the first node N1.

Further, the first and the third metal options mt_opt1, mt_opt3 are disconnected and the fourth metal option mt_opt4 is connected so as to turn off the NMOS transistor NM2.

Figure 4:
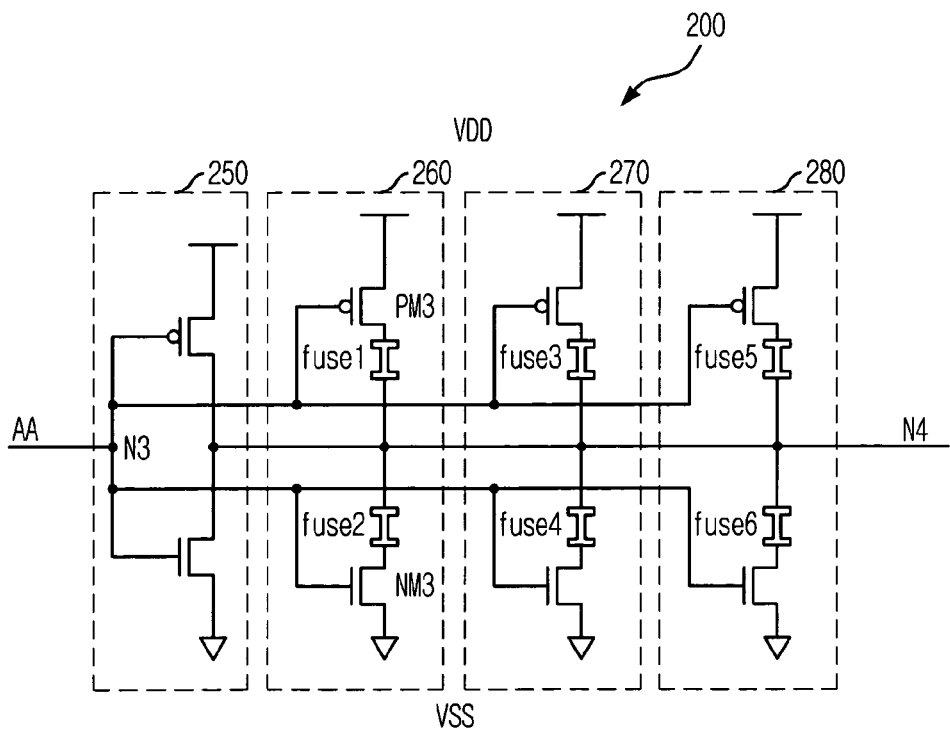
FIG. 4 is an internal circuit diagram of another embodiment of a window adjusting unit in FIG. 2.

FIG. 4 is an internal circuit diagram of another embodiment of the window adjusting unit 200 in FIG. 2.

Referring to FIG. 4, the window adjusting unit 200 includes a first driving unit 250 for driving an output node N4 in response to the output signal AA from the buffering unit 100, and a second to a fourth driving units 260, 270, 280, 290 for driving the output node N4 in response to the output signal AA from the buffering unit 100 based on fuse options fuse1, fuse2, fuse3, fuse4, fuse5, fuse6.

It will be described only for the second driving unit 260 since the second to the fourth driving units 260, 270, 280, 290 have same circuit configuration. The second driving unit 260 includes a PMOS transistor PM3 having a gate receiving the output signal AA from the buffering unit 100 and a source coupled to the power voltage VDD, the first fuse option fuse1 arranged between a drain of the PMOS transistor PM3 and the output node N4, a NMOS transistor NM3 having a gate receiving the output signal AA from the buffering unit 100 and a source coupled to the power voltage VSS, and a second fuse option fuse2 arranged between a drain of the NMOS transistor NM3 and the output node N4.

As such, the window adjusting unit of this embodiment adjusts the number of the driving units for driving the output node N4 through the fuse options fuse1, fuse2, fuse3, fuse4, fuse5, fuse6 in order to have the high-effective data period and the low-effective data period of the output signal equal to each other.

For example, when the high-effective data period of the output signal is longer than the low-effective data period, the fuse options fuse1, fuse3, fuse5 are cut to turn on the predetermined number of the NMOS transistors of the second to fourth driving units 260, 270, 280 and turn off the PMOS transistors.

Otherwise, when the low-effective data period of the output signal is longer than the high-effective data period, the fuse options fuse2, fuse4, fuse6 are cut to turn on the predetermined number of the PMOS transistors of the second to fourth driving units 260, 270, 280 and turn off the NMOS transistors.

Figure 5:
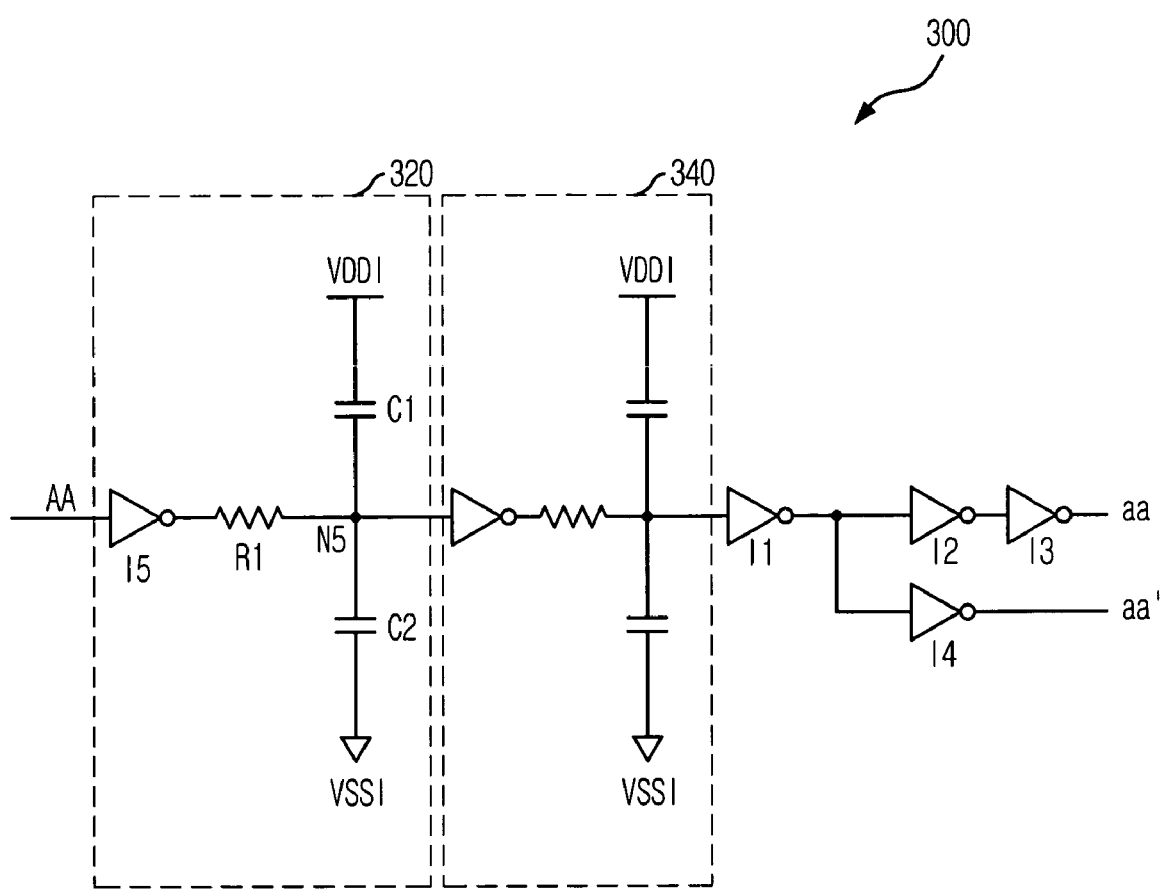
FIG. 5 is an internal circuit diagram of a delaying unit in FIG. 2.

FIG. 5 is an internal circuit diagram of a delaying unit 300 in FIG. 2.

Referring to FIG. 5, the delaying unit 300 includes a first and a second delaying devices 320, 340 serially coupled to each other for delaying the output signal from the window adjusting unit 200, a first inverter I1 for inverting the output signal from the second delaying device 340, a second and a third inverters I2, I3 serially coupled for outputting the output signal from the first inverter I1 as the positive output aa, and a fourth inverter I4 for inverting the output signal from the first inverter I1 as the negative output aa'.

It will be described only for the first driving device 320 since the first and the second driving devices 320, 340 have same circuit configuration. The first delaying device 320 includes an inverter I5 for inverting the output signal from the window adjusting unit 200, a resistor R1 arranged between the output node of the inverter I5 and a node N5, a first capacitor C1 arranged between the power voltage VDDI and the node N5, and a second capacitor C2 arranged between the node N5 and the power voltage VSSI.

Therefore, the semiconductor memory device of the present invention employs the window adjusting unit having metal options or fuse options to make the high-effective data period and the low-effective data period of the output signal be equal to each other. Accordingly, there is no costly or timely loss.

Figure 6:
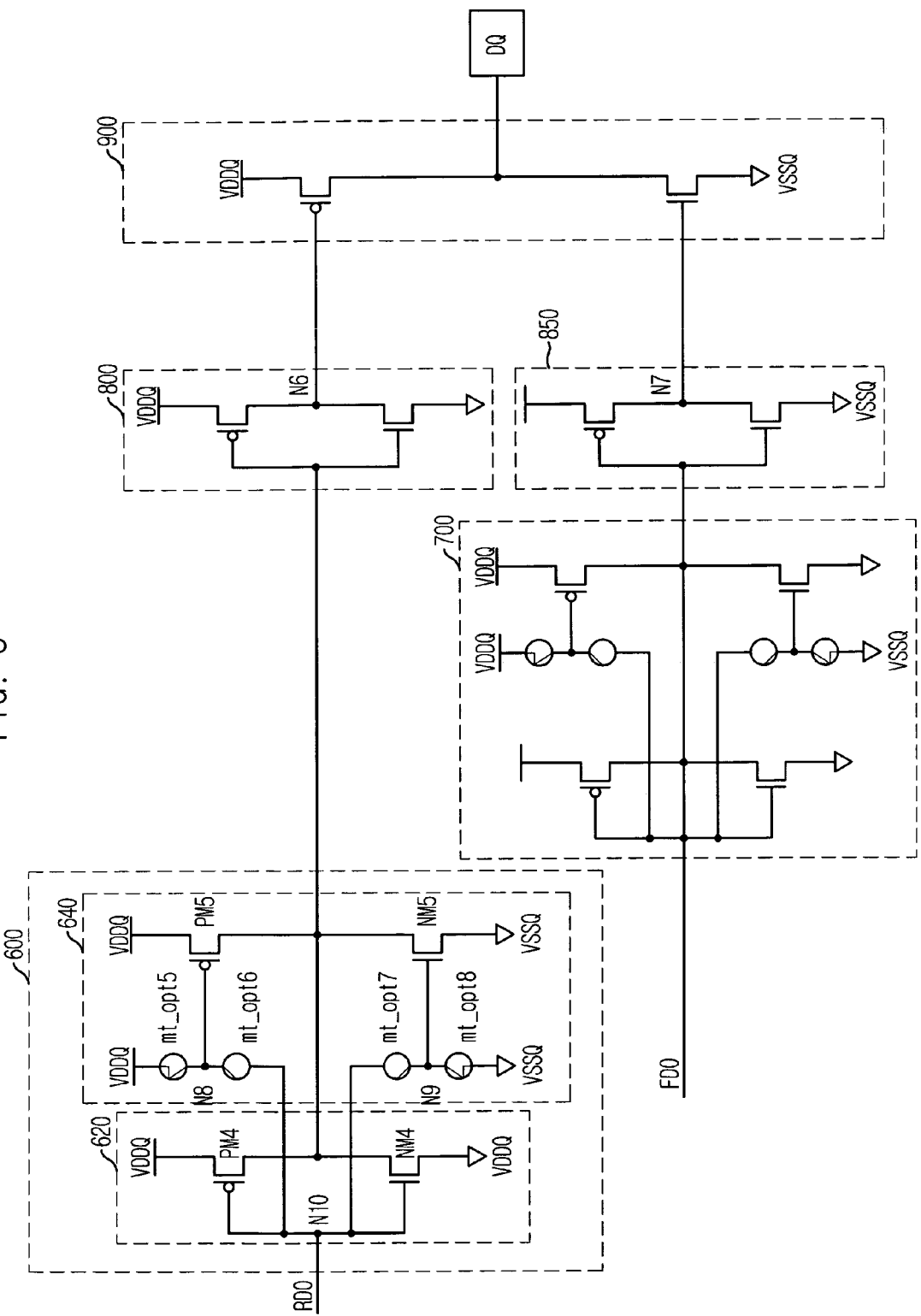
FIG. 6 is a block diagram showing a semiconductor memory device in accordance with another embodiment of the present invention.

FIG. 6 is a block diagram showing a semiconductor memory device in accordance with another embodiment of the present invention, in which effective data period of rising output data RDO and falling output data FDO from a data pin DQ are adjusted.

Referring to FIG. 6, the semiconductor memory device zincludes a rising window adjusting unit 600 for adjusting the effective data period of the rising output data RDO, a falling window adjusting unit 700 for adjusting the effective data period of the falling output data FDO, and an output data driving unit 800, 850, 900 for driving a data pin with the output signals from the rising window adjusting unit 600 and the falling window adjusting unit 700.

The output data driving unit includes a rising pre-driving unit 800 for driving an output node N6 in response to the output signal of the rising window adjusting unit 600, a falling pre-driving unit 850 for driving an output node N7 in response to the output signal of the falling window adjusting unit 700, and a main driver 900 for driving the data pin in response to the voltage on each output node of the rising pre-driving unit 800 and the falling pre-driving unit 850.

The rising window adjusting unit 600 includes a first driving unit 620 for driving the output signal corresponding to the rising output data RDO, and a second driving unit 640 for additionally driving the output signal corresponding to the rising output data RDO based on metal options mt_opt5, mt_opt6, mt_opt7, mt_opt8.

The first driving unit 620 includes a PMOS transistor PM4 and an NMOS transistor NM4 having the rising output data RDO as the respective gate inputs, and serially coupled between a power voltage VDDQ and a second power voltage VSSQ.

The second driving unit 640 includes a first metal option mt_opt5 arranged between the power voltage VDDQ and a node N8, a second metal option mt_opt6 arranged between the node N8 and the input node N10 of the rising window adjusting unit, a third metal option mt_opt7 arranged between the input node N10 of the rising window adjusting unit and the node N9, a fourth metal option mt_opt8 between the node N9 and the power voltage VSSQ, and a PMOS transistor PM5 and a NMOS transistor NM5 having the voltages on the nodes N8, N9 as the respective gate inputs, and serially coupled to each other between the power voltage VDDQ and the power voltage VSSQ.

Further, it will omitted for detailed description of the falling window adjusting unit 700 since it is implemented as same as the rising window adjusting unit 800 except that it adjusts the effective data period of the falling output data FDO.

As such, the semiconductor memory device of the second embodiment employs the rising window adjusting unit 600 and the falling window adjusting unit 700 that are implemented with metal options mt_opt5, mt_opt6, mt_opt7, mt_opt8 so as to make the high-effective data period and the low-effective data period of the data from the data pin DQ being equal to each other.

Therefore, the semiconductor memory device of the one embodiment of the present invention is capable of adjusting the high-effective data period and the low-effective data period of the signal through the metal options or fuse options in the window adjusting unit.

Further, such a window adjusting unit is used in the input path or output path within the semiconductor memory device to make the high-effective data period and the low-effective data period of the signal being equal to each other, which reduces costly and timely loss.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device for transmitting inputted data comprising:
    buffering means for buffering the input data;
    window adjusting means for adjusting a window of the buffered data outputted from the buffering means in response to a plurality of metal options; and
    transmitting means for delivering output of the window adjusting means into a core block, wherein the window adjusting means includes:
    a first metal option arranged between a first power voltage and a first node;
    a second metal option arranged between the first node and a input node of the window adjusting means, and
    a first output driving unit for driving the data delivering node according to a voltage level of the first node,
    wherein the first and second metal options are serially coupled between the first power voltage and the input node of the window adjusting means, and the first node is coupled to the first output driving unit.

2. The semiconductor memory device as recited in claim 1, wherein the window adjusting means outputs an inverse data of the buffered data to the transmitting means.

3. The semiconductor memory device as recited in claim 2, wherein the transmitting means includes an inverting block for inverting the output data of the window adjusting means.

4. The semiconductor memory device as recited in claim 1, wherein the window adjusting means includes:
    a first driving means for receiving the buffered signal to thereby generate a first data; and
    a second driving means for receiving the buffered signal to thereby generate a second data of which window is adjusted by the plurality of metal options,
    wherein the first data and the second data are combined as the output of the window adjusting means and the second driving means includes the first metal option, the second metal option and the first output driving unit.

5. The semiconductor memory device as recited in claim 4, wherein the first driving means includes a first PMOS transistor and a first NMOS transistor having the output signal from the buffering means as the respective gate inputs and being serially coupled to each other between the first power voltage and a second power voltage.

6. The semiconductor memory device as recited in claim 4, wherein the second driving means further includes:
   a third metal option arranged between the input node and a second node;
   a fourth metal option arranged between the second node and a second power voltage; and
   a second output driving unit for driving the data delivering node according to a voltage level of the second node.

7. A semiconductor memory device comprising:
   rising window adjusting means for receiving rising output data as input data and adjusting effective data period of the rising output data;
   falling window adjusting means for receiving falling output data as input data and adjusting effective data period of the falling output data; and
   output data driving means for driving an output data pad with the output signals from the rising window adjusting means and the falling window adjusting means,
   wherein each of the rising window adjusting means and the falling window adjusting means includes:
      a first metal option arranged between a first power voltage and a first node;
      a second metal option arranged between the first node and an input node of the window adjusting means; and
      a first output driving unit for driving the data delivering node according to a voltage level of the first node,
      wherein the first and second metal options are serially coupled between the first power voltage and the input node of the window adjusting means, and the first node is coupled to the first output driving unit.

8. The semiconductor memory device as recited in claim 7, wherein the rising window adjusting means includes:
   first driving means for driving the output signal corresponding to the rising output data; and
   second driving means for additionally driving the output signal corresponding to the rising output data based on a plurality of metal options,
   wherein the second driving means includes the first metal option, the second metal option and the first output driving unit.

9. The semiconductor memory device as recited in claim 8, wherein the first driving means includes a first PMOS transistor and a first NMOS transistor having the rising output data as the respective gate inputs, and serially coupled to each other between the first power voltage and a second power voltage.

10. The semiconductor memory device as recited in claim 8, wherein the second driving means further includes:
    a third metal option arranged between the input node of the rising window adjusting means and a second node;
    a fourth metal option between the second node and a second power voltage; and
    a second output driving unit for driving the data delivering node according to a voltage level of the second node.

11. The semiconductor memory device as recited in claim 7, wherein the falling window adjusting means includes:
    first driving means for driving the output signal corresponding to the falling output data; and
    second driving means for additionally driving the output signal corresponding to the falling output data based on a plurality of metal options,
    wherein the second driving means includes the first metal option, the second metal option and the first output driving unit.

12. The semiconductor memory device as recited in claim 11, wherein the first driving means includes a first PMOS transistor and a first NMOS transistor having the falling output data as the respective gate inputs, and serially coupled to each other between the first power voltage and a second power voltage.

13. The semiconductor memory device as recited in claim 11, wherein the second driving means further includes:
    a third metal option arranged between the input node of the falling window adjusting means and a second node;
    a fourth metal option between the second node and a second power voltage; and
    a second output driving unit for driving the data delivering node according to a voltage level of the second node.

* * * * *